United States Patent [19]

Chao et al.

[11] Patent Number: 4,905,074
[45] Date of Patent: Feb. 27, 1990

[54] INTERDIFFUSION RESISTANT FE-NI ALLOYS HAVING IMPROVED GLASS SEALING PROPERTY

[75] Inventors: Chung-Yao Chao, Hamden; John F. Breedis, Trumbull, both of Conn.

[73] Assignee: Olin Corporation, New Haven, Conn.

[21] Appl. No.: 934,279

[22] Filed: Nov. 24, 1986

Related U.S. Application Data

[62] Division of Ser. No. 803,021, Nov. 29, 1985, Pat. No. 4,816,216.

[51] Int. Cl.$^4$ .............................................. H01L 23/54
[52] U.S. Cl. ......................................... 357/67; 357/70
[58] Field of Search ............................ 357/70, 67, 74; 148/310, 442, 327, 159, 162, 134; 428/653, 654, 619, 680, 681; 420/448, 452, 453, 538, 547; 427/88, 89, 90

[56] References Cited

U.S. PATENT DOCUMENTS

| | | | |
|---|---|---|---|
| 1,556,776 | 10/1925 | Flintermann | 420/4 |
| 1,757,178 | 5/1930 | Elmer | 420/94 |
| 1,768,443 | 6/1930 | Elmer | 178/45 |
| 1,811,032 | 6/1931 | Smith et al. | 148/120 |
| 2,891,883 | 6/1959 | Howe | 148/2 |
| 3,024,142 | 3/1962 | Parkin | 148/310 |
| 3,247,031 | 4/1966 | Littmann et al. | |
| 3,559,285 | 2/1971 | Kauffman | 357/70 |
| 3,657,026 | 4/1972 | Colling | 148/120 |
| 3,698,964 | 10/1972 | Caule et al. | |
| 3,705,023 | 12/1972 | Fister, Jr. | 420/128 |
| 3,705,827 | 12/1972 | Muzyka et al. | 148/142 |
| 3,730,779 | 5/1973 | Caule et al. | |
| 3,810,754 | 5/1974 | Ford et al. | |
| 3,811,874 | 5/1974 | Caule et al. | |
| 3,929,470 | 12/1975 | Gray | |
| 4,006,012 | 2/1977 | Kindlimann | 420/451 |
| 4,013,425 | 3/1977 | Muhlberger et al. | 428/619 |
| 4,013,459 | 3/1977 | Raghavan | |
| 4,019,900 | 4/1977 | Raghavan et al. | |
| 4,040,876 | 8/1977 | Bleiberg et al. | 148/327 |
| 4,078,920 | 3/1978 | Liljas et al. | 148/442 |
| 4,082,580 | 4/1978 | Pfeifer et al. | 148/108 |
| 4,099,966 | 7/1978 | Chivinsky et al. | 148/442 |
| 4,149,910 | 4/1979 | Popplewell | |
| 4,262,165 | 4/1981 | Ohwaki et al. | 357/74 |
| 4,302,247 | 11/1981 | Abe et al. | 148/442 |
| 4,340,435 | 7/1982 | Jin et al. | 148/310 |
| 4,489,040 | 12/1984 | Asphahani et al. | 148/442 |
| 4,500,605 | 2/1985 | Fister et al. | |
| 4,525,598 | 6/1985 | Tsukemoto et al. | 428/653 |
| 4,536,229 | 8/1985 | Jin et al. | 148/310 |
| 4,649,083 | 3/1987 | Fister et al. | |
| 4,711,826 | 12/1987 | Shapiro et al. | |
| 4,816,216 | 3/1989 | Chao et al. | 420/94 |

FOREIGN PATENT DOCUMENTS

| | | |
|---|---|---|
| 50-78513 | 6/1975 | Japan |
| 57-29557 | 1/1982 | Japan |
| 57-26144 | 2/1982 | Japan |
| 58-16057 | 1/1983 | Japan |
| 59-59861 | 4/1984 | Japan |
| 60-25262 | 8/1985 | Japan |
| 61-149461 | 7/1986 | Japan |

OTHER PUBLICATIONS

Materials Engineering, 12/86, pp. 100, 105.

Primary Examiner—Rolf Hille
Assistant Examiner—S. V. Clark
Attorney, Agent, or Firm—Gregory S. Rosenblatt; Paul Weinstein

[57] ABSTRACT

The present invention relates to an iron-nickel alloy containing from about 30% to about 60% nickel, from 0.001% to about 0.15% nitrogen, at least one element selected from the group consisting of from about 1% to about 10% molybdenum and from about 0.001% to about 2% aluminum and the balance essentially iron. The alloys demonstrate improved resistance to intermediate compound formation, improved glass to metal sealing properties, and improved wirebonding performance. The alloys of the present invention have particular utility as a lead frame material for semiconductor packages.

13 Claims, 1 Drawing Sheet

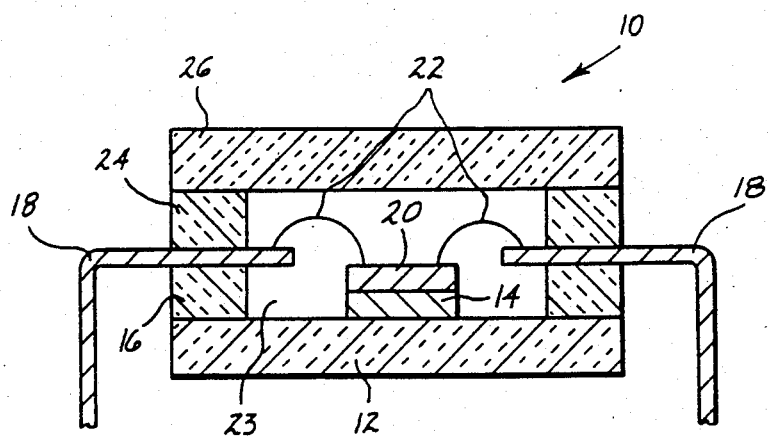

INTERDIFFUSION RESISTANT FE-NI ALLOYS HAVING IMPROVED GLASS SEALING PROPERTY

This application is a division of application Ser. No. 803,021, filed Nov. 29, 1985 now U.S. Pat. No. 4,816,216 issued on Mar. 28, 1989.

The present invention relates to iron-nickel alloys having particular utility in electronic and electrical applications. The iron-nickel alloys contain nitrogen and at least one element selected from the group consisting of molybdenum and aluminum.

Iron-nickel alloys and iron-nickel-molybdenum alloys in particular are well known magnetic alloys. These alloys are characterized by such desirable magnetic properties as high initial permeability, high resistivity, good consistency of permeability, and good magnetic stability. U.S. Pat. Nos. 1,757,178 to Elmer, 2,407,234 to Guthrie et al., 2,891,883 to Howe, 3,024,142 to Parkin, 4,082,580 to Pfeifer et al., and 4,536,229 to Jin et al. illustrate some of these iron-nickel and iron-nickel-molybdenum magnetic alloys.

Iron alloys including iron-nickel alloys have also found use in electronic applications. For example, lead frames in CERDIPs and pins in TO cans have been fabricated from iron-nickel alloys. The use of these alloys, however, has not been without serious problems. In semiconductor devices, the iron-nickel alloy lead frame is typically joined to an integrated circuit chip by a number of aluminum and/or aluminum alloy lead wires. The junctions between the iron alloy lead frame and the aluminum lead wires are typically sites where brittle intermetallic compounds are formed as a result of the strong tendency for interdiffusion between iron and aluminum upon exposure to heat, such as the thermal treatment(s) associated with packaging the semiconductor device.

This intermetallics problem is generally dealt with by forming a thin aluminum stripe on one or more surfaces of the iron alloy lead frame. The aluminum stripe may be a thin coating applied to the surface or an inlay. In some cases, the stripe comprises a coating over an entire lead frame surface. The lead wires are then bonded to the aluminum stripe so that an aluminum/aluminum couple is formed. U.S. Pat. No. 3,559,285 to Kauffman illustrates an iron alloy lead frame material having an inlaid aluminum stripe.

Another problem associated with the use of iron alloys as lead frame materials has to do with glass sealing. Many semiconductor integrated circuit chips are packaged in a ceramic package known as a CERDIP. To provide a hermetic package structure, the lead frame is bonded to one or more layers of a ceramic material by a sealing glass material such as those having a lead oxide base. Iron alloys such as Fe-42Ni do not bond well to sealing glass materials. Again, an aluminum stripe on or in the lead frame material is used to overcome this bonding problem since aluminum typically bonds well to sealing glasses.

Manufacturers of semiconductor devices and/or packages have expressed a desire for iron alloys that can be used as lead frame materials without having to coat or stripe the lead frames. By avoiding coating and/or striping of the lead frame, the manufacturing costs can be reduced. Desirable alloys are those characterized by improved resistance to intermetallic compound formation and improved bonding ability to sealing glass materials.

Accordingly, it is an object of the present invention to provide an iron-nickel alloy having improved resistance to intermetallic compound formation.

It is a further object of the present invention to provide an alloy as above having improved glass adhesion properties.

It is a further object of the present invention to provide an alloy as above having improved wirebonding characteristics.

It is a further object of the present invention to provide iron-nickel alloys as above suitable for use as lead frame materials in semiconductor devices.

These and other objects and advantages will become more apparent from the following description and drawings wherein like reference numerals depict like elements.

The present invention achieves the aforementioned objects by making additions of nitrogen and at least one element selected from the group consisting of molybdenum and aluminum to iron-nickel alloys. The addition of nitrogen and molybdenum with or without aluminum to iron-nickel alloys has been found to improve the resistance of the alloys to the formation of intermetallic compounds, particularly during the heat treatments associated with typical semiconductor manufacturing and/or packaging techniques. Further, alloys containing these additions have been found to have improved bond adhesion with glass sealing materials and to be readily bondable to aluminum or aluminum alloy lead wires using standard commercial ultrasonic bonding techniques.

Alloys in accordance with the present invention contain from about 30% to about 60% nickel, from about 0.001% to about 0.15% nitrogen, at least one element selected from the group consisting of about 1% to about 10% molybdenum and from about 0.001% to about 2% aluminum, and the balance essentially iron. The alloys are characterized by having a single phase and a face centered cubic metallurgical structure. The alloys also preferably have an iron:nickel ratio in the range of about 1.1:1 to about 1.6:1. Preferred alloys contain from about 39% to about 55% nickel, from about 0.005% to about 0.05% nitrogen, at least one element selected from the group consisting of about 1% to about 4% molybdenum and about 0.3% to about 1.0% aluminum, and the balance essentially iron.

The FIGURE is a cross sectional view of a semiconductor package.

The present invention relates to iron-nickel alloys having improved resistance to intermetallic compound formation and/or improved adhesion to glass sealing materials. These alloys have particular utility in electrical and electronic applications. For example, the alloys may be used for lead frames or similar components in semiconductor packages. Alternatively, they can be used for pins in TO cans, glass-to-metal power feed throughs or other similar applications.

Referring now to the Figure, a typical semiconductor package 10 is illustrated. The package 10 comprises a ceramic base 12, a first glass layer 16 and a number of leads 18 from a lead frame bonded to the ceramic base 12 by the glass layer 16. A semiconductor device 20 is mounted to the base 12 by either a die attach pad or a layer of gold containing material 14. The gold containing material is used in many modern packages to permit formation of a gold-silicon eutectic bond between the layer 14 and the chip 20. The gold containing layer 14 may comprise either a gold plating or a gold paste fired to the ceramic base 12. The device 20 is connected to the leads 18 by a number of lead wires 22. Generally, the lead wires are formed from aluminum or an aluminum alloy such as Al-1%Si. A second glass layer 24 is positioned over the leads 18 of the lead frame assembly. To complete the package, a cover 26 formed from a ceramic or metallic material is placed over the glass layer 24.

In some packages, the glass layer 24 and the cover 26 each have a central aperture or window to permit the device 20 to be bonded to the pad or layer 14 and the wire connections to be made after the glass layer 24 and/or the cover 26 have been fused to the glass layer 16. A cap not shown is provided to close the window after the device has been positioned on the pad and the wire connections are made. The cap may be formed from a ceramic material, a metallic material such as gold plated Kovar, or a glass material.

To fabricate the semiconductor package illustrated in the Figure, the die attach pad or gold containing layer 14 is first bonded to or plated onto the ceramic base 12. The glass layer 16 is then screen printed on the ceramic base and air fired, leaving an aperture or window 23 for connecting the semiconductor device 20 to the pad or layer 14. The lead frame with the leads 18 is then positioned on the glass layer 16 and fused into placed. Preferably, the second glass layer 24 is joined to the cover 26 before being fused to the layer 16. Thereafter, the glass layer 24 is fused to the glass layer 16 to form a hermetic package structure. Prior to this, however, the device 20 is attached to the pad or layer 14 and the wire interconnections are made between the device 20 and the leads 18. Typically, the wire interconnections are made using either a thermocompression, ultrasonic or thermosonic bonder in an ambient atmosphere. This wire bonding operation often results in surface oxides being formed on the leads 18.

Typical ceramic materials used in packaging integrated circuit chips or semiconductor devices include aluminum oxide and beryllium oxide. The glass layers 16 and 24 in these packages may be formed from any suitable glass material such as an 85% lead oxide—15% boric acid composition.

It should be recognized that the package shown in the Figure and the discussion attendant thereto are meant to be illustrative and are not meant to limit the scope of the invention. The alloys of the present invention may be used in conjunction with a wide variety of package constructions and materials.

As previously discussed, the leads 18 and the lead frames in many modern packages are formed from iron alloys such as Fe-42Ni. The use of these alloys as lead frame materials has engendered several significant problems. These problems include: (1) the formation of intermetallic compounds at the junctions between the leads 18 and the lead wires 22, particularly when the lead wires 22 are formed from aluminum or an aluminum alloy; and (2) poor adhesion between the leads 18 and the glass layers 16 and 24. The intermetallic compound problem is significant because it adversely affects the quality of the wire interconnections. Many semiconductor devices fail because the wire interconnections become brittle and break. The poor adhesion problem is important because it can lead to poor package hermeticity characteristics and breakage of the package. Attempts to overcome these problems have included coating and/or striping the leads 18 of the lead frames with materials such as aluminum, gold, and alloys thereof. Of course, coating and/or striping increases the costs associated with the manufacture of the package.

In accordance with the present invention, these problems are overcome by using for the leads and the lead frame an iron alloy which exhibits improved resistance to intermetallic compound formation and/or improved adhesion to glass sealing materials. Alloys of the present invention include those having a composition consisting essentially of from about 30% to about 60% nickel, from about 0.001% to about 0.15% nitrogen, at least one element selected from the group consisting of about 1% to about 10% molybdenum and from about 0.001% to about 2% aluminum, and the balance essentially iron. Preferably, the iron:nickel ratio in the alloy is in a range from about 1.1:1 to about 1.6:1.

Nitrogen has been found to be a particularly beneficial addition because it significantly reduces the formation of undesirable iron-aluminum intermetallic compounds. The molybdenum and aluminum additions are beneficial in that they improve the glass adhesion properties and wirebonding performance of the alloys. Molybdenum is also useful in that it increases the nitrogen solubility and/or diffusivity in the iron-nickel alloys of the present invention and is believed to interact with surface oxides in a way that helps to improve bonding between the alloys of the present invention and glass sealing materials.

Particularly useful embodiments include: (a) an alloy consisting essentially of from about 39% to about 55% nickel, from about 0.005% to about 0.05% nitrogen, from about 1% to about 4% molybdenum and the balance essentially iron; and (b) an alloy consisting essentially of from about 39% to about 55% nickel, from about 0.005% to about 0.05% nitrogen, from about 0.3% to about 1.0% aluminum and the balance essentially iron. Alloy (a) is particularly useful when the material is subjected to temperatures high enough to form intermetallic compounds. Alloy (b) is particularly useful when the temperatures are not high enough to form intermetallic compounds. If desired, an aluminum addition in the range from about 0.3% to about 1.0% may be made to alloy (a) to further improve the glass sealing properties of the alloy.

Metallurgically, the alloys of the present invention are characterized by a face-centered cubic structure. In addition, the alloys are single phase alloys.

When molybdenum is to be added to the iron-nickel alloys and the iron-nickel alloy is to be bonded to a pure aluminum component, the minimum molybdenum content for the alloy may be defined by using the following equation:

$$\%Mo \geqq (86 \pm 5 - \%Ni)/(7.25 \pm 1.25) \qquad (1)$$

For certain molybdenum embodiment alloys of the present invention, it is also possible to determine a minimum nitrogen content for the alloy. For example, alloys containing nickel in the range from about 39% to about 47% and molybdenum in the range from 1% to about 5.1%, it is preferred to make a minimum nitrogen addition in accordance with the following equation:

$$\%N = (0.0001) \times (341 - 7.5Ni + 7.4Mo) \qquad (2)$$

If desired, the alloys of the present invention may also contain manganese in an effective amount up to about 1.0% and/or magnesium in an effective amount up to about 0.1%. The manganese and/or magnesium additions are believed to be particularly useful in reducing the effects of sulfur impurities during casting.

For improved intermetallic compound suppression properties, silicon should not be present in the alloy. This is because silicon diminishes the effect of the nitrogen on intermetallics by combining with the nitrogen to form silicon nitride. Conventional mill impurities may be tolerated in the alloys of the present invention but should be kept at impurity levels.

As used herein, the foregoing alloy composition percentages are weight percentages.

The alloys of the present invention may be cast in any desired manner, including but not limited to Durville casting, continuous casting and direct chill casting, into an ingot or strip form. After casting, the alloy may be hot worked such as by hot rolling and/or cold worked such as by cold rolling with at least one interanneal. Preferably, the alloys are cold worked for strength without prior hot working. When cold worked for strength, a reduction in the range of about 20% to about 40% is taken using standard cold rolling techniques.

The interanneals may be performed in a 96%$N_2$-4%$H_2$ atmosphere at a temperature in the range of about 800° C. to about 1000° C. for a time in the range of about 1 hour to about 24 hours. Preferably, the interanneals are performed in the aforesaid atmosphere at a temperature in the range from about 900° C. to about 975° C. for a time period in the range from about 2 hours to about 8 hours. If desired, the interanneals may be used to charge the alloy with nitrogen. Alternatively, the nitrogen addition could be made by blowing nitrogen gas into a melt containing iron, nickel, molybdenum and/or aluminum. Any suitable technique known in the art such as using a blowing lance may be employed to add the nitrogen to the melt. In yet another alternative approach, the alloy may be charged with nitrogen by annealing the cast ingot or strip in a cracked ammonia atmosphere.

After processing, the iron-nickel strip material may be fabricated into a desired product such as a lead frame in accordance with any standard fabrication technique known in the art.

To demonstrate the improvements of the present invention, the following examples were performed.

EXAMPLE I

To demonstrate the improved resistance to intermetallic compound formation possessed by the alloys of the present invention, a series of alloys having the compositions shown in Table I were prepared. The alloys were charged with nitrogen by heating the alloys in a 96%$N_2$ -4%$H_2$ atmosphere at 950 °C.

TABLE I

| Alloy | Ni (wt %) | Mo (wt %) | Al (wt %) | N (wt %) | Fe (wt %) |
|-------|-----------|-----------|-----------|----------|-----------|
| A | 42 | — | — | .01 | bal. |
| B | 42 | 0.7–6 | — | — | bal. |
| C | 42 | 2.8–9.1 | — | .01 | bal. |
| D | 41 | — | 0.7–2.1 | .01 | bal. |
| E | 40 | 2.5 | 0.8–1.8 | .01 | bal. |

A 2" ×4" coupon of each alloy was bonded to an aluminum alloy coupon. The aluminum alloy contained 1.25%Si. Bonding was done using the POSIT-BOND ® bonding technique in which the coupons were subjected to a 60% cold working reduction. The coupons were mechanically cleaned and degreased prior to bonding. The bonded coupons were exposed to 500° C. temperatures for 16 hours. The thickness of the intermetallic compounds formed during this heat treatment was measured. Table II reports the results of these measurements.

TABLE II

| Alloy | Intermetallic Thickness ($\mu$m) |
|-------|-----------------------------------|
| A | 12 |
| B | 11–12 |
| C | 2 |
| D | 11 |
| E | 2 |

The data in Table II shows that the thickness of the intermetallic compounds formed between the Fe-Ni and Al-Si components was retarded by the addition of nitrogen and molybdenum with or without aluminum to the iron-nickel alloys. This is evidenced by the results obtained using Alloys C and E.

In order for manufacturers to dispense with using aluminum-coated or -striped iron-nickel alloy components in semiconductor packages, the substitute iron-nickel alloys should demonstrate equivalent or substantially equivalent glass sealing properties. The following example illustrates the improvements in glass sealing properties which can be obtained with the alloys of the present invention.

EXAMPLE II

A series of iron-nickel alloys having the compositions shown in Table III were prepared. For comparison purposes, an aluminum coated Fe-42Ni alloy sample also was prepared. Coupons of each of the alloys were bonded to a commercially available aluminum oxide CERDIP material so as to form a glass-metal-glass sandwich. Prior to bonding the iron alloy coupons were degreased.

After bonding the glass-metal-glass sandwiches were subjected to a standard Torque Test used in conjunction with integrated circuit packages. In this test, the samples were twisted until they broke. Table III reports the results of this test.

TABLE III

| Alloy | Torque Strength(in-lb) |
|-------|------------------------|
| Al—coated Fe—42Ni | 74–82 |
| Fe—42Ni—0.0027N | 0 |
| Fe—40Ni—2.8Mo—.0058N | >50 |
| Fe—41Ni—2.7Mo—0.8Al—.01N | >50 |
| Fe—42Ni—0.7Al—.01N | >50 |

As can be seen from Table III, those alloys formed in accordance with the present invention demonstrated torque strengths comparable to those achieved by coating Fe-42Ni with aluminum. Table III also shows that merely adding nitrogen to Fe-42Ni does not improve the glass sealing properties of the alloy. The improvements in glass sealing adhesion provided by the alloys of the present invention is believed to be the result of obtaining a chemical bond between the glass and metal instead of the squeeze mechanical type bond found with prior art materials.

In order to dispense with aluminum coating/striping of Fe-42Ni lead frames, it is also necessary to directly wire bond aluminum or aluminum alloy lead wires to a bare alloy lead frame and obtain failure loads comparable to those obtained using the aluminum coated alloys. The following example illustrates the improvements in wirebonding obtained with the alloys of the present invention.

EXAMPLE III

A series of iron-nickel substrates having the compositions reported in Table IV were prepared. To simulate typical wire bonding operations, the substrates were wire bonded to a 1.25 mil wire formed from an Al-1%Si alloy using a Kulicke & Soffa Model #484-8 wire bonder. All substrates were subjected to an air frame sink treatment for 8 minutes at a peak temperature of 493° C. Table IV reports the results of the average load required to break the connection between the wire and the various substrates.

TABLE IV

| Substrate | Average Wire Pull Load (gm) |
|---|---|
| Al—striped Fe—42Ni | 12 |
| Bare Fe—42Ni | 9 |
| Fe—40Ni—2.8Mo—.01N | 10 |
| Fe—42Ni—0.7Al—.01N | 10 |
| Fe—41Ni—2.1Al—.01N | 9 |
| Fe—41Ni—2.6Mo—0.45Al—.01N | 12 |
| Fe—42Ni—2.5Mo—1.8Al—.01N | 10 |

As can be seen from Table IV, substrates formed from the alloys of the present invention generally exhibited improved wire bonding performance as compared to bare iron-nickel alloy substrates.

While the alloys of the present invention have particular utility in electronic and electrical applications, they also have utility in other applications where increased resistance to intermetallic compound formation and/or improved glass adhesion properties are needed. For example, the alloys of the present invention may be used in composite structures such as iron-nickel/glass composites and iron-nickel alloy/aluminum or aluminum alloy composites.

The patents set forth in the specification are intended to be incorporated by reference herein.

It is apparent that there has been provided in accordance with this invention interdiffusion resistant iron-nickel alloys having improved glass sealing which fully satisfy the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed:

1. A structure having: a component formed from a single phase alloy consisting essentially of from about 30% to about 60% nickel, from about 0.001% to about 0.15% nitrogen, at least one element selected from the group of from about 1% to about 10% molybdenum and from about 0.001% to about 2% aluminum, and the balance essentially iron.

2. The structure of claim 1 further comprising:
at least one aluminum or aluminum alloy component bonded to said iron-nickel alloy component.

3. The structure of claim 1 further comprising:
at least one layer of non-metallic material bonded to said iron-nickel alloy component.

4. The structure of claim 3 wherein said non-metallic material comprises a glass material.

5. The structure of claim 2 wherein:
said structure comprises a semiconductor package;
said iron-nickel alloy component comprises at least one lead of a lead frame; and
said at least one aluminum or aluminum alloy component comprises at least one lead wire.

6. The structure of claim 5 further comprising:
said lead frame being entirely formed from said alloy.

7. The structure of claim 6 further comprising:
each said lead wire being formed from a silicon containing aluminum alloy.

8. The structure of claim 5 further comprising:
a semiconductor device; and
each said lead being connected to said device by at least one lead wire.

9. The structure of claim 6 further comprising:
at least one layer of a glass sealing material bonded to said iron-nickel alloy lead frame.

10. The structure of claim 9 further comprising:
at least one component formed from a ceramic material, said iron-nickel alloy lead frame being bonded to said at least one ceramic material component by said at least one glass sealing material layer so as to form a hermetic package.

11. The structure of claim 1 having a component formed from an alloy consisting essentially of from about 39% to about 55% nickel, from about 0.005% to about 0.05% nitrogen, at least one element selected from the group consisting of about 1% to about 4% molybdenum, about 0.3% to about 1.0% aluminum or combinations thereof, and the balance essentially iron.

12. The structure of claim 1 having a component formed from a chromium free alloy consisting essentially of from about 30% to about 60% nickel, from about 0.00% to about 0.15% nitrogen, at least one element selected from the group consisting of from about 1% to about 10% molybdenum and from about 0.001% to about 2% aluminum, and the balance essentially iron.

13. The structure of claim 12 having a component formed from a chromium free alloy consisting essentially of from about 39% to about 55% nickel, from about 0.005% to about 0.05% nitrogen, at least one element selected from the group consisting of about 1% to about 4% molybdenum, about 0.3% to about 1.0% aluminum or combinations thereof, and the balance essentially iron.

* * * * *

UNITED STATES PATENT AND TRADEMARK OFFICE
CERTIFICATE OF CORRECTION

PATENT NO. : 4,905,074

DATED : February 27, 1990

INVENTOR(S) : Chung-Yao Chao et al

It is certified that error appears in the above—identified patent and that said Letters Patent is hereby corrected as shown below:

Column 8, line 46, please delete "0.00%" and insert ---0.001%--- in its place.

Signed and Sealed this

Twelfth Day of May, 1992

Attest:

DOUGLAS B. COMER

Attesting Officer

Acting Commissioner of Patents and Trademarks